(12) United States Patent
Zhang et al.

(10) Patent No.: US 9,903,892 B2
(45) Date of Patent: Feb. 27, 2018

(54) LOW POWER SMALL AREA OSCILLATOR-BASED ADC

(71) Applicant: QUALCOMM Incorporated, San Diego, CA (US)

(72) Inventors: Chuang Zhang, San Diego, CA (US); Nan Chen, San Diego, CA (US); Junmou Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 519 days.

(21) Appl. No.: 14/480,321

(22) Filed: Sep. 8, 2014

(65) Prior Publication Data

US 2016/0069939 A1   Mar. 10, 2016

(51) Int. Cl.

| G01R 19/252 | (2006.01) |
|---|---|
| G01R 23/10 | (2006.01) |
| H03M 1/06 | (2006.01) |
| H03M 1/12 | (2006.01) |
| H03M 1/60 | (2006.01) |

(52) U.S. Cl.
CPC .......... *G01R 19/252* (2013.01); *G01R 23/10* (2013.01); *H03M 1/0607* (2013.01); *H03M 1/1295* (2013.01); *H03M 1/60* (2013.01)

(58) Field of Classification Search
USPC .......... 324/76.39, 76.11, 123 R, 120, 140 R, 324/681, 713; 341/155, 120, 118, 164; 331/34, 111, 177 R, 46, 57; 374/142, 374/183; 323/282; 327/101, 115, 261; 361/79

See application file for complete search history.

(56) References Cited

U.S. PATENT DOCUMENTS

| 5,301,121 | A | * | 4/1994 | Garverick | .............. | G01R 19/25 |
| | | | | | | 324/115 |
| 6,111,533 | A | | 8/2000 | Yuan et al. | | |
| 7,636,023 | B1 | | 12/2009 | Suzuki | | |
| 7,775,710 | B2 | * | 8/2010 | Mukherjee | ............. | G01K 1/026 |
| | | | | | | 327/512 |
| 7,982,550 | B1 | * | 7/2011 | Quevy | .................... | H03L 1/022 |
| | | | | | | 331/176 |
| 8,081,101 | B2 | | 12/2011 | Daniels et al. | | |
| 8,207,770 | B1 | | 6/2012 | Ravi et al. | | |
| 8,421,663 | B1 | | 4/2013 | Bennett | | |

(Continued)

OTHER PUBLICATIONS

International Search Report and Written Opinion—PCT/US2015/041426—ISA/EPO—Oct. 23, 2015.

(Continued)

*Primary Examiner* — Melissa Koval
*Assistant Examiner* — Nasima Monsur
(74) *Attorney, Agent, or Firm* — Loza & Loza, LLP

(57) ABSTRACT

In one embodiment, a method for measuring current comprises generating a sensor current based on a current being measured. The method also comprises converting a combined current into a first frequency, wherein the combined current is a sum of the sensor current and a common-mode current, and converting the first frequency into a first count value. The method further comprises converting the common-mode current into a second frequency, converting the second frequency into a second count value, and subtracting the second count value from the first count value to obtain a current reading.

27 Claims, 8 Drawing Sheets

(56) References Cited

U.S. PATENT DOCUMENTS

2005/0121617 A1* 6/2005 Heismann ............. G01T 1/2928
　　　　　　　　　　　　　　　　　　　　　　　　250/370.11
2007/0195856 A1* 8/2007 Blom ....................... G01K 7/01
　　　　　　　　　　　　　　　　　　　　　　　　374/117

OTHER PUBLICATIONS

Liao Y-T., et al., "A 3-µW CMOS Glucose Sensor for Wireless Contact-Lens Tear Glucose Monitoring", IEEE Journal of Solid-State Circuits, IEEE Service Center, Piscataway, NJ, USA, vol. 47, No. 1, Jan. 1, 2012 (Jan. 1, 2012), pp. 335-344, XP011391139, ISSN: 0018-9200, DOI: 10.1109/JSSC.2011.2170633.

Yao H., et al., "A Dual Microscale Glucose Sensor on a Contact Lens, Tested in Conditions Mimicking the Eye", IEEE 24th International Conference on Micro Electro Mechanical Systems (MEMS 2011), IEEE, US, Jan. 23, 2011 (Jan. 23, 2011), pp. 25-28, XP031982341, DOI: 10.1109/MEMSYS.2011.5734353, ISBN: 978-1-4244-9632-7.

Jinwen Xiao et al., "An Ultra-Low-Power Digitally-Controlled Buck Converter IC for Cellular Phone Applications," 2004, Proc IEEE Appl Power Electronics Conf, 19, pp. 383-391.

* cited by examiner

LOW POWER SMALL AREA OSCILLATOR-BASED ADC

BACKGROUND

Field

Aspects of the present disclosure relate generally to analog-to-digital converters (ADCs), and more particularly, to oscillator-based ADCs.

Background

One or more current sensors may be integrated on a chip to monitor current on the chip. For example, a chip may comprise a plurality of blocks (e.g., processing cores, a modem, etc.) and a separate current sensor for each block to measure the amount of current drawn by the respective block. A current sensor may generate an analog signal that is a function of the current being measured (e.g., proportional to the current being measured), and convert the analog signal into a digital current reading using an analog-to-digital converter (ADC).

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a method for measuring current is described herein. The method comprises generating a sensor current based on a current being measured. The method also comprises converting a combined current into a first frequency, wherein the combined current is a sum of the sensor current and a common-mode current, and converting the first frequency into a first count value. The method further comprises converting the common-mode current into a second frequency, converting the second frequency into a second count value, and subtracting the second count value from the first count value to obtain a current reading.

A second aspect relates to an apparatus for measuring current. The apparatus comprises means for generating a sensor current based on a current being measured. The apparatus also comprises means for converting a combined current into a first frequency, wherein the combined current is a sum of the sensor current and a common-mode current, and means for converting the first frequency into a first count value. The apparatus further comprises means for converting the common-mode current into a second frequency, means for converting the second frequency into a second count value, and means for subtracting the second count value from the first count value to obtain a current reading.

A third aspect relates to a current sensor. The current sensor comprises a sensor circuit configured to generate a sensor current based on a current being measured. The current sensor also comprises a first current-controlled oscillator configured to convert a combined current into a first frequency, wherein the combined current is a sum of the sensor current and a common-mode current, and a first counter configured to convert the first frequency into a first count value. The current sensor further comprises a second current-controlled oscillator configured to convert the common-mode current into a second frequency, a second counter configured to convert the second frequency into a second count value, and a subtractor configured to subtract the second count value from the first count value to obtain a current reading.

A fourth aspect relates to a current sensor. The current sensor comprises a sensor circuit configured to generate a sensor current based on a current being measured, a current-controlled oscillator coupled to a common-mode current, and a switch configured to selectively couple the sensor current to the current-controlled oscillator. The current sensor also comprises a controller configured to close the switch during a first period of time and to open the switch during a second period of time, wherein the current-controlled oscillator is configured to convert a combined current into a first frequency during the first period of time, the combined current being a sum of the sensor current and the common-mode current, and to convert the common-mode current into a second frequency during the second period of time. The current sensor further comprises a counter configured to convert the first frequency into a first count value and to convert the second frequency into a second count value, and a subtractor circuit configured to subtract the second count value from the first count value to obtain a current reading.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

Figure 1:
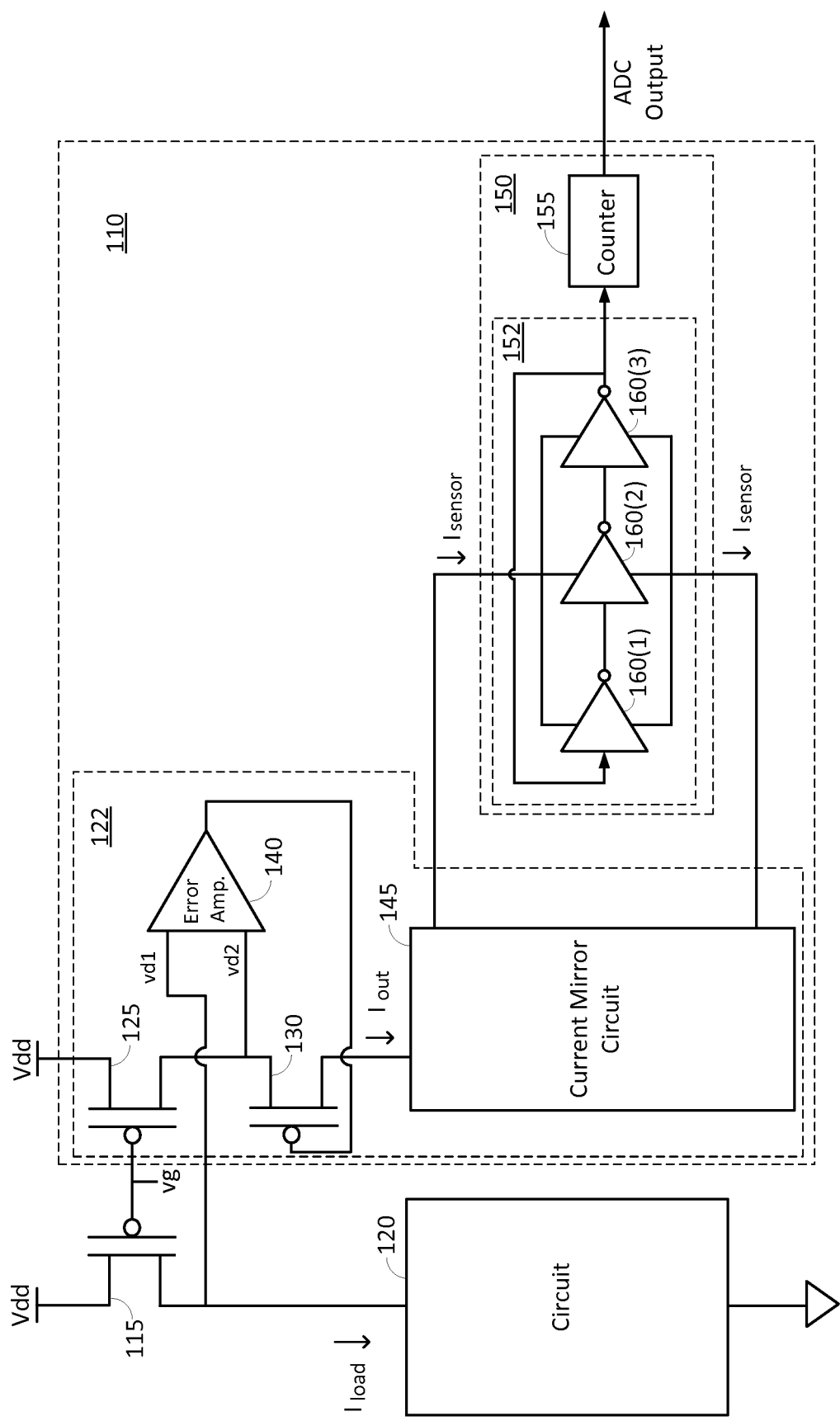
FIG. 1 shows a current sensor according to an embodiment of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

One or more current sensors may be integrated on a chip to monitor current on the chip. For example, a chip may comprise a plurality of blocks (e.g., processing cores, a modem, etc.) and a separate current sensor for each block to measure the amount of current drawn by the respective block. The current sensors may output their current measurements to a current-management system that manages the blocks based on the current measurements.

For example, the current-management system may compare the measured current for a block to a current threshold. If the measured current exceeds the current threshold, then the current-management system may take steps to reduce the current (e.g., by reducing an operating frequency of the block, shutting down the block, etc.). The current threshold may be set to a value that prevents the temperature of the block from becoming too high, which can potentially damage the chip. For example, the current threshold may be set to a value that prevents the chip from entering thermal runaway. Thermal runaway occurs when increases in temperature causes leakage current in the chip to increase, which, in turn, causes further increases in temperature. The resulting positive feedback can cause the temperature of the chip to rapidly increase, potentially damaging the chip.

In another example, the current-management system may estimate a total current for the chip from the current measurements and compare the total current to an upper current limit (e.g., 12 Amps) for the chip. The upper current limit may be imposed by a customer of the chip (e.g., a device manufacturer that incorporates the chip into a device). The customer may impose the upper current limit (e.g., make the upper current limit a condition of purchasing the chip) to prevent the device from overheating and/or malfunctioning. In this example, if the total current approaches the upper current limit, then the current-management system may take steps to prevent the total current from exceeding the upper current limit (e.g., by reducing the operating frequency of one or more blocks, shutting down one or more blocks, etc.).

A traditional current sensor may use a resistor ladder to convert a sensed current into a voltage, and use a successive approximation register (SAR) analog-to-digital converter (ADC) to convert the voltage into a digital current reading. A drawback of this approach is that the SAR ADC consumes a relatively large chip area and a relatively large amount of power. This may limit the number of current sensors that can be placed on the chip. Accordingly, there is a need for a current sensor that uses a small and low power ADC.

FIG. 1 shows a current sensor 110 according to an embodiment of the present disclosure. The current sensor 110 comprises an oscillator-based ADC 150, which may be much smaller and consume much less power that a SAR ADC, as discussed further below. This allows the current sensor 110 to be much smaller and consume much less power than a current sensor that includes a SAR ADC.

In the example shown in FIG. 1, the current sensor 110 is configured to measure current supplied to a circuit 120 (e.g., a processor core) from a power-supply rail Vdd through a power transistor 115 (also referred to as a power switch or a bulk head switch). The power transistor 115 may comprise a p-type metal-oxide-semiconductor (PMOS) transistor with a source coupled to the power-supply rail Vdd and a drain coupled to the circuit 120. The current supplied to the circuit 120 may be referred to as a load current (denoted "$I_{load}$").

A power-management system (not shown) may control the gate voltage (denoted "vg") of the power transistor 115 to selectively turn the power transistor 115 on and off. For example, the power-management system may turn on the power transistor 115 when the circuit 120 (e.g., processor core) is active by pulling down the gate voltage vg to ground, and may turn off the power transistor 115 when the circuit 120 is inactive (not in use) by pulling up the gate voltage vg to the supply voltage Vdd. The power transistor 115 may be turned off when the circuit 120 is inactive to reduce leakage current when the circuit 120 is inactive.

The current sensor 110 comprises a sensor circuit 122 configured to sense the load current flowing through the power transistor 115, and generate a sensor current (denoted "$I_{sensor}$") based on the load current (e.g., proportional to the load current). In this regard, the sensor circuit 122 comprises a current-sensing transistor 125 with a source coupled to the power-supply rail Vdd, and a gate coupled to the gate of the power transistor 115. The current-sensing transistor 125 is configured to generate a scaled-down copy of the load current passing through the power transistor 115, as discussed further below.

In one aspect, the current-sensing transistor 125 generates an output current (denoted "$I_{out}$") that is approximately equal to the load current $I_{load}$ multiplied by a scaling factor that is less than one. For example, if the current-sensing transistor 125 has a channel width approximately equal to 1/1000 the channel width of the power transistor 115, then the scaling factor may be approximately 1/1000 (assuming the transistors 115 and 125 have the same channel length). In this example, the output current $I_{out}$ is approximately equal to 1/1000 the load current $I_{load}$. The output current $I_{out}$ may be made much smaller than the load current $I_{load}$ to reduce the power consumed by the current sensor 110. For example, the channel width of the power transistor 115 may be at least ten times greater than the channel width of the current-sensing transistor 125.

In the example shown in FIG. 1, the current-sensing transistor 125 comprises a PMOS transistor, although it is to be appreciated that the present disclosure is not limited to this example. It is also to be appreciated that FIG. 1 is not drawn to scale, and that the power transistor 115 may be much larger than the current-sensing transistor 125, and the circuit 120 (e.g., processor core) may be much larger than the current sensor 110.

The sensor circuit 122 also comprises an error amplifier 140 and a feedback transistor 130. The error amplifier 140 has a first input coupled to the drain of the power transistor 115, and a second input coupled to the drain of the current-sensing transistor 125. The error amplifier 140 amplifies the difference between the drain voltage of the power transistor 115 (denoted "vd1") and the drain voltage of the current-sensing transistor 125 (denoted "vd2") to generate an output voltage at the output of the amplifier 140. The feedback transistor 130 (e.g., PMOS transistor) has a source coupled to the drain of the current-sensing transistor 125, and a gate coupled to the output of the amplifier 140. Coupling the output of the amplifier 140 to the gate of the feedback transistor 130 forms a feedback loop that causes the amplifier 140 to adjust the output voltage to the gate of the feedback transistor 130 in a direction that reduces the difference between the drain voltages of the power transistor 115 and the current-sensing transistor 125. As a result, the feedback loop forces the drain voltages of the power transistor 115 and the current-sensing transistor 125 to be approximately equal (assuming the amplifier 140 has a high gain and a small input referred offset). This helps ensure that the output current $I_{out}$ of the current-sensing transistor 125 is approximately proportional to the load current $I_{load}$.

The sensor circuit 122 also comprises a current mirror circuit 145 configured to receive the output current $I_{out}$, and generate the sensor current $I_{sensor}$ based on the output current. The sensor current $I_{sensor}$ may be approximately equal to the output current $I_{out}$ or approximately equal to the output current $I_{out}$ multiplied by a current-mirror scaling factor. The current mirror circuit 145 may input the sensor current $I_{sensor}$ to and draw the sensor current $I_{sensor}$ from the ADC 150, as shown in FIG. 1. The sensor current $I_{sensor}$ is approximately proportional to the load current $I_{load}$, and may therefore be used to measure the load current $I_{load}$, as discussed further below.

The ADC 150 comprises a ring oscillator 152 that converts the sensor current $I_{sensor}$ into an oscillator frequency, and a counter 155 that converts the oscillator frequency into a digital count value that provides a digital current reading. In this example, the ring oscillator 152 comprises an odd number of inverters 160(1)-160(3) coupled in series, in which the output of the last inverter 160(3) is coupled to the input of the first inverter 160(1). The oscillator 152 is a current-controlled oscillator (e.g., current-starved oscillator) with an oscillator frequency that is a function of the sensor current $I_{sensor}$. More particularly, the sensor current $I_{sensor}$ controls how quickly capacitors (e.g., gate capacitors) in the oscillator 152 charge and discharge, which, in turn, controls how quickly the inverters 160(1)-160(3) are able to change logic states. The higher the current, the faster the inverters 160(1)-160(3) are able to change logic states, and therefore the faster the oscillator frequency. Although three inverters 160(1)-160(3) are shown in FIG. 1 for ease of illustration, it is to be appreciated that the oscillator 152 may include any odd number of inverters.

The oscillator-based ADC 150 is much smaller and consumes less power than the SAR ADC. However, the oscillator-based ADC 150 may have a narrow input dynamic range that makes it unsuitable for measuring current over a wide dynamic range, as discussed further below with reference to FIG. 2.

Figure 2:
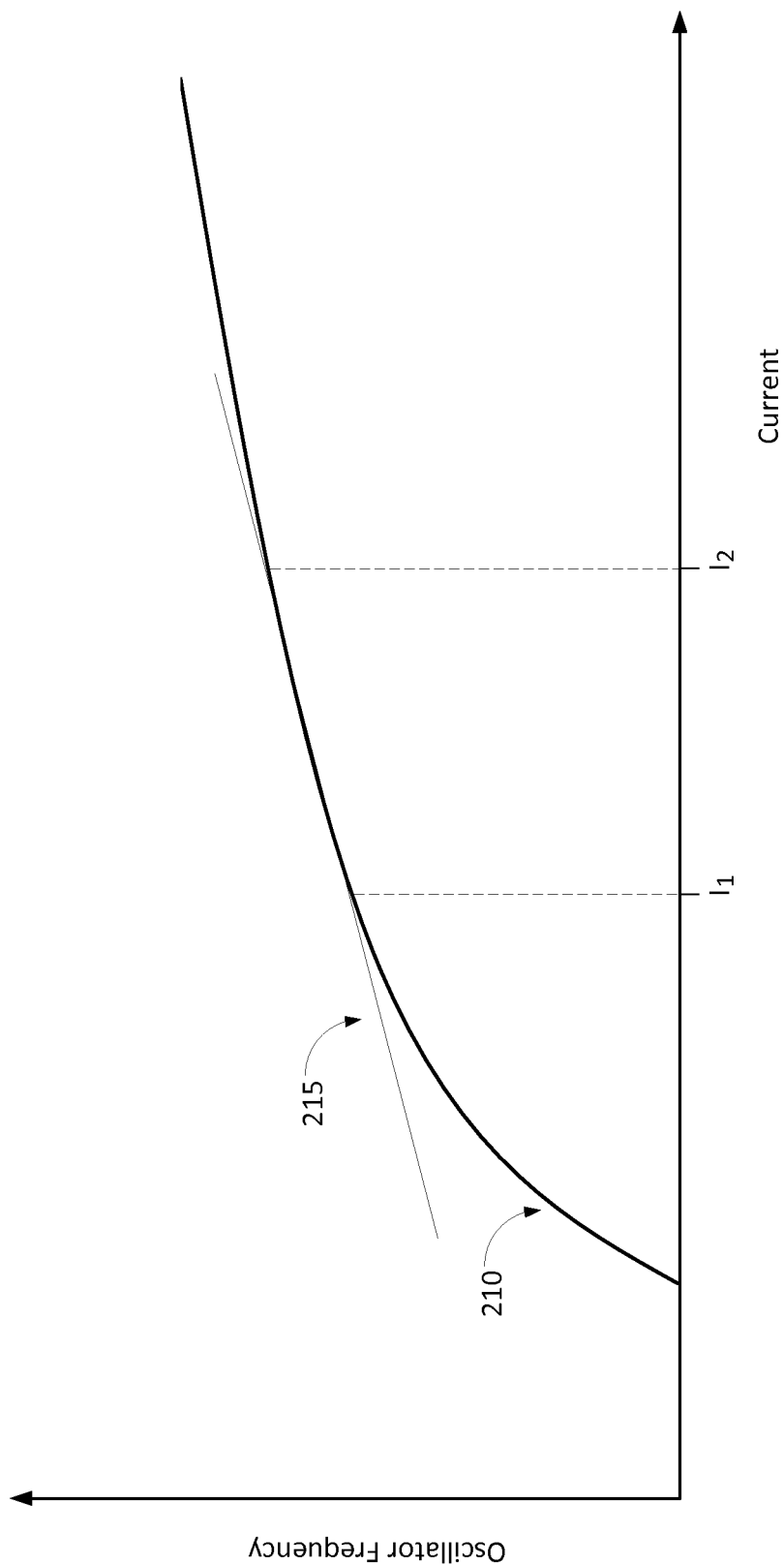
FIG. 2 is a plot illustrating an example of oscillator frequency as a function of current according to an embodiment of the present disclosure.

FIG. 2 is a plot showing an example of the oscillator frequency 210 as a function of the sensor current $I_{sensor}$. As shown in FIG. 2, when the sensor current is low, the oscillator cuts out and the oscillator frequency is approximately zero. As the sensor current is increased, the oscillator enters a linear region, in which the relationship between the oscillator frequency 210 and the sensor current $I_{sensor}$ is approximately linear (i.e., approximates the linear line 215 shown in FIG. 2). In the linear region, the charging and discharging of capacitors (e.g., gate capacitors) in the oscillator 152 by the sensor current $I_{sensor}$ is the dominate factor (limiting factor) controlling the oscillator frequency. As the current is increased further, the oscillator 152 leaves the linear region. This is because other factors that are non-linearly related to the sensor current $I_{sensor}$ begin to have a greater influence on the oscillator frequency.

In this example, the dynamic input range of the oscillator 152 is relatively narrow, in which the dynamic input range is a ratio of the largest current (denoted "$I_2$") in the linear region over the smallest current (denoted "$I_1$") in the linear region. As shown in the example in FIG. 2, the dynamic input range can be as low as two or less.

A problem with the narrow dynamic input range of the oscillator 152 is that the desired dynamic input range for the current sensor can be much larger, in which the desired dynamic input range may be a ratio of the maximum current to be measured by the current sensor over the minimum current to be measured by the current sensor. For example, for a digital current reading with seven-bit resolution, it may be desirable for the current sensor to have a dynamic input range of 100 or more. As a result, the ADC 150 in FIG. 1 may be unsuitable for a current sensor intended to measure current over a wide dynamic range.

Figure 3:
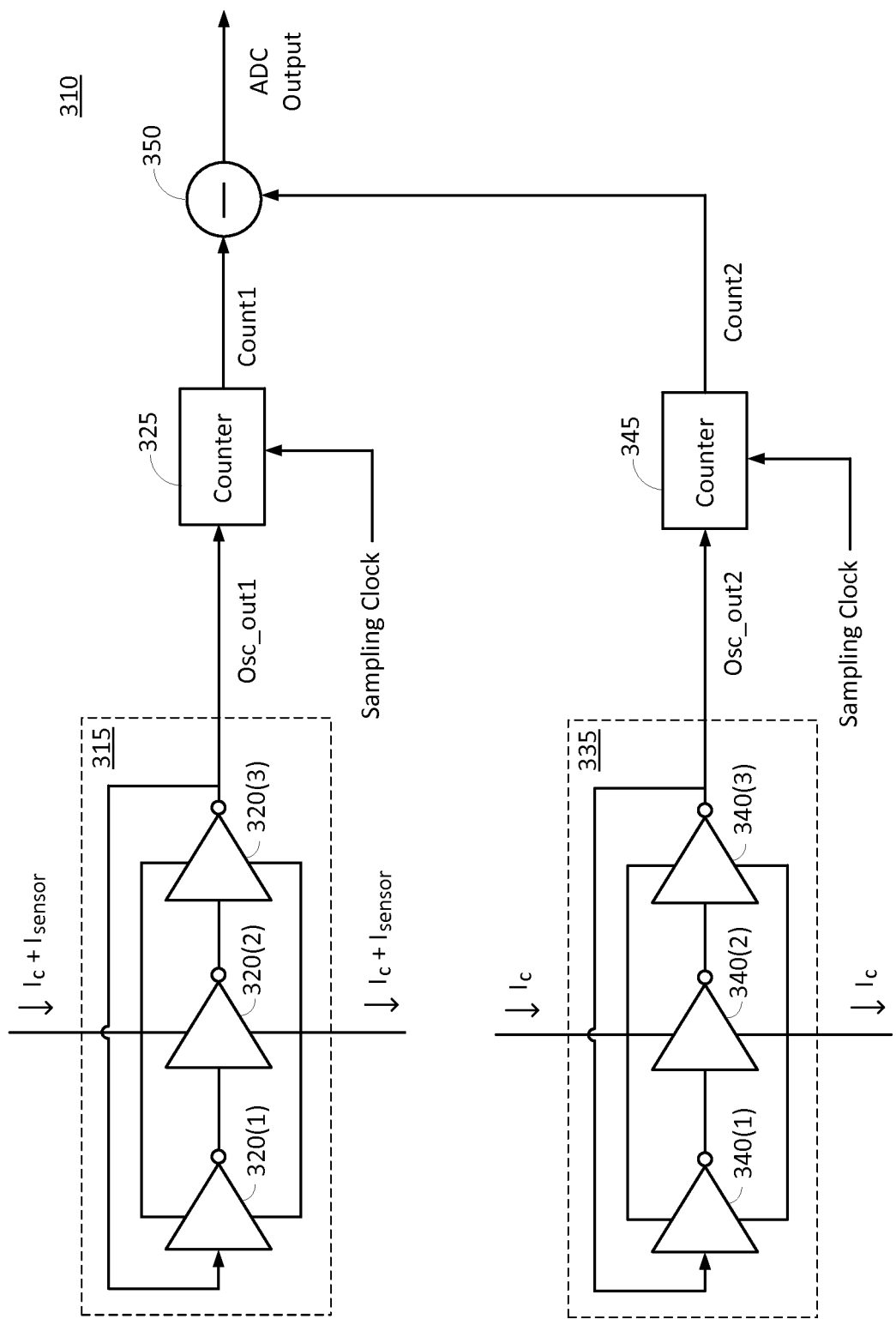
FIG. 3 shows an oscillator-based analog-to-digital converter (ADC) according to an embodiment of the present disclosure.

FIG. 3 shows an oscillator-based ADC 310 with improved linearly over a wide dynamic input range according to an embodiment of the present disclosure. The ADC 310 comprises a first ring oscillator 315, a second ring oscillator 335, a first counter 325, a second counter 345, and a subtractor 350.

The first ring oscillator 315 comprises an odd number of inverters 320(1)-320(3) coupled in series, in which the output of the last inverter 320(3) is coupled to the input of the first inverter 320(1). Similarly, the second ring oscillator 335 comprises an odd number of inverters 340(1)-340(3) coupled in series, in which the output of the last inverter 340(3) is coupled to the input of the first inverter 340(1). The first and second oscillators 315 and 335 may have substantially identical structures.

As shown in FIG. 3, a combined current that is the sum of the sensor current $I_{sensor}$ and a common-mode current (denoted "$I_c$") is input to the first oscillator 315. As discussed above, the sensor current $I_{sensor}$ is approximately proportional to the load current being measured, and may be provided by the current mirror circuit 145 shown in FIG. 1. The common-mode current $I_c$ is a current that is common to both the first and second oscillators 315 and 335, as discussed further below. The common-mode current $I_c$ may be a relatively constant current (e.g., a DC current), and may be provided by a current source (not shown in FIG. 3). As shown in FIG. 3, the combined current may also be drawn from the first oscillator 315. The combined current input to the first oscillator 315 is used to charge capacitors (e.g., gate capacitors) in the first oscillator 315 while the combined current drawn from the first oscillator 315 is used to discharge capacitors (e.g., gate capacitors) in the first oscillator 315. Thus, the oscillator frequency of the first ring oscillator 315 is a function of the combined current $I_c+I_{sensor}$.

The dynamic range of the combined current input to the first ring oscillator 315 may be a ratio of $I_c+I_{sensor\_max}$ over $I_c+I_{sensor\_min}$, where $I_{sensor\_max}$ is the maximum sensor current corresponding to the largest current to be measured and $I_{sensor\_min}$ is the minimum sensor current corresponding to the smallest current to be measured. The dynamic range of the combined current can be made much smaller than the dynamic range of the sensor current $I_{sensor}$ input to the ADC 310. For example, if the common-mode current $I_c$ is chosen to be approximately equal to the maximum sensor current $I_{sensor\_max}$, then the dynamic range of the combined current is approximately two (assuming $I_{sensor\_max} \gg I_{sensor\_min}$). In another example, if the common-mode current $I_c$ is chosen to be approximately equal to twice the maximum sensor current $I_{sensor\_max}$, then the dynamic range of the combined current is approximately 1.5 (assuming $I_{sensor\_max} \gg I_{sensor\_min}$). This allows the dynamic range of the combined current to fit within the narrow dynamic input range of the first ring oscillator 315.

Thus, even though the sensor current $I_{sensor}$ input to the ADC 310 has a wide dynamic range (e.g., 100 or more), the dynamic range of the combined current $I_c+I_{sensor}$ input to the first oscillator 315 can be made much smaller (e.g., two or less) to fit within the narrow dynamic range of the first oscillator 315. For example, the dynamic range of the sensor current may be at least ten time greater than the dynamic range of the combined current. This allows the first oscillator 315 to operate in the linear region over the wide dynamic range of the sensor current $I_{sensor}$.

The first counter 325 converts the oscillator frequency of the first oscillator 315 (denoted "Osc_out1") into a first digital count value (denoted "Count1") by counting a number of oscillation cycles of the first oscillator 315 over a period of time (sample period). The period of time may be defined by a predetermined number of cycles of a sampling clock signal input to the first counter 325. The sampling clock signal may be generated by a clock (not shown).

The common-mode current $I_c$ is input to the second ring oscillator 335, where the common-mode current is common to both oscillators 315 and 335. As shown in FIG. 3, the common-mode current $I_c$ may also be drawn from the second oscillator 335. The common-mode current input to the second oscillator 335 is used to charge capacitors (e.g., gate capacitors) in the second oscillator 335 while the common-mode current drawn from the second oscillator 335 is used to discharge capacitors (e.g., gate capacitors) in the second oscillator 335. Thus, the oscillator frequency of the second ring oscillator 335 is a function of the common-mode current $I_c$. The second counter 345 converts the oscillator frequency of the second oscillator 335 (denoted "Osc_out2") into a second digital count value (denoted "Count2") by counting a number of oscillation cycles of the second oscillator 335 over a period of time (sample period). The period of time may be defined by the predetermined number of cycles of the sampling clock signal, which may also be input to the second counter 345.

The subtractor 350 subtracts the second count value Count2 from the first count value Count1, and outputs the resulting difference (differential count value) as the output of the ADC 310. The subtraction subtracts out the portion of the first count value due to the common-mode current $I_c$. As a result, the output of the ADC 310 is approximately a linear function of the sensor current $I_{sensor}$. Since the sensor current $I_{sensor}$ is approximately proportional to the load current, the output of the ADC 310 provides a measurement of the load current. Thus, the ADC 310 is able to provide a digital current reading of the load current over a wide dynamic input range using small and low power oscillators 315 and 335.

The subtraction may also subtract out temperature dependencies that are common to both oscillators 315 and 335. As a result, the output of the ADC 310 (differential count value) may be less sensitive to changes in temperature.

In one aspect, the common-mode current $I_c$ may be chosen and the sensor current $I_{sensor}$ may be scaled such that the current range of the combined current ($I_c+I_{sensor\_min}$ to $I_c+I_{sensor\_max}$) fits within the linear range of the first oscillator 315. For example, the common-mode current $I_c$ may be set to a value that is approximately equal to the smallest current in the linear region of the first oscillator 315 (e.g., current $I_1$ in FIG. 2). The sensor current $I_{sensor}$ may then be scaled so that the maximum sensor current $I_{sensor\_max}$ is approximately equal to or less than the difference between the largest current in the linear region (e.g., current $I_2$ in FIG. 2) and the sum of the smallest current in the linear region and the minimum sensor current $I_{sensor\_min}$. The sensor current may be scaled, for example, by adjusting the channel width of the current-sensing transistor 125 relative to the channel width of the power transistor 115. As a result, the range of the combined current ($I_c+I_{sensor\_min}$ to $I_c+I_{sensor\_max}$) fits within the linear region of the first oscillator 315.

In contrast, it may not be possible to scale the sensor current in FIG. 1 to fit within the linear region of the oscillator 152 without the common-mode current, especially when the dynamic range (e.g., 100) of the sensor current greatly exceeds the dynamic input range (e.g., two or less) of the oscillator 152. For example, if the sensor current is scaled so that the minimum sensor current $I_{sensor\_min}$ is approximately equal to the smallest current in the linear region of the oscillator 152, then the maximum sensor current may greatly exceed the largest current in the linear region of the oscillator 152. In another example, if the sensor current is scaled so that the maximum sensor current $I_{sensor\_max}$ is approximately equal to the largest current in the linear region of the oscillator 152, then the minimum sensor current may be well below the smallest current in the linear region of the oscillator 152.

Figure 4:
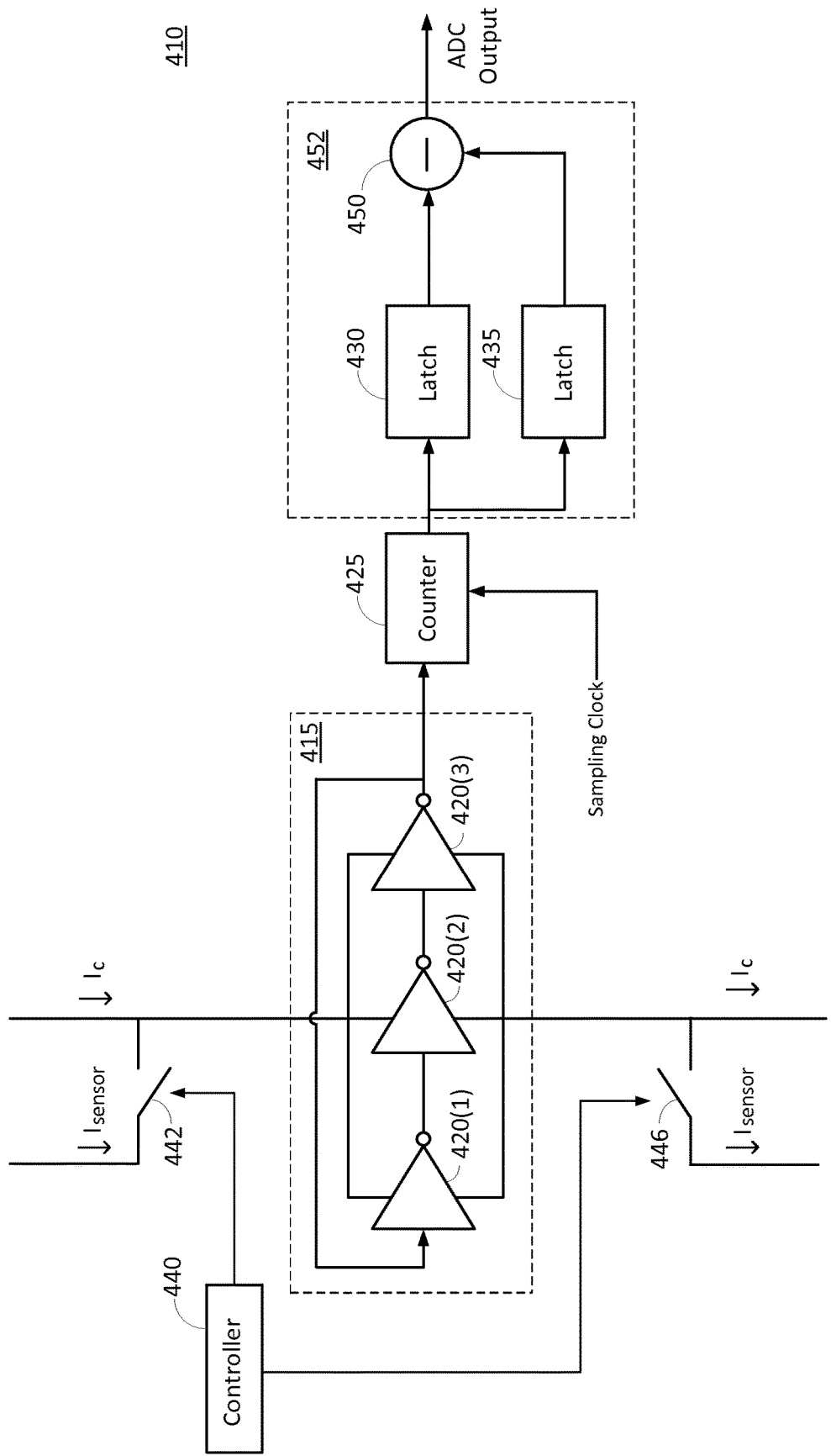
FIG. 4 shows an oscillator-based ADC according to another embodiment of the present disclosure.

FIG. 4 shows an oscillator-based ADC 410 according to another embodiment of the present disclosure. In this embodiment, the ADC 410 uses one oscillator 415 with time interleaving, as discussed further below. The oscillator 415 comprises an odd number of inverters 420(1)-420(3) coupled in series, in which the output of the last inverter 420(3) is coupled to the input of the first inverter 420(1).

The ADC 410 comprises a first switch 442, a second switch 446, a counter 425, a subtractor circuit 452, and a controller 440. The subtractor circuit 452 comprises a first latch 430, a second latch 435, and a subtractor 450. As discussed further below, the subtractor circuit 452 is configured to receive first and second count values from the counter 425 at different times and subtract the second count value from the first count value.

The first and second switches 442 and 446 control whether the sensor current $I_{sensor}$ is coupled to the oscillator 415. When the switches 442 and 446 are closed, the combined current $I_c+I_{sensor}$ is input to and drawn from the oscillator 415 for capacitor charging/discharging. When the switches 442 and 446 are open, only the common-mode current $I_c$ is input to and drawn from the oscillator 415 for capacitor charging/discharging. The switches 442 and 446 are controlled by the controller 440, as discussed further below.

In operation, the controller 440 may initially close the switches 442 and 446 so that the combined current $I_c+I_{sensor}$ is input to and drawn from the oscillator 415. The counter 425 converts the resulting oscillator frequency into a first count value by counting a number of oscillation cycles of the oscillator 415 over a first period of time (first sample period). The first period of time may be defined by a predetermined number of cycles of a sampling clock signal input to the counter 425. The first count value is latched by the first latch 430 of the subtractor circuit 452. Thus, the first count value in the first latch 430 is a function of the combined current $I_c+I_{sensor}$.

The controller 440 may then open the switches 442 and 446 so that only the common-mode current $I_c$ is input to and drawn from the oscillator 415. The counter 425 converts the resulting oscillator frequency into a second count value by counting a number of oscillation cycles of the oscillator 415 over a second period of time (second sample period). The second period of time may be defined by a predetermined number of cycles of the sampling clock signal, in which the first period of time and the second period of time may be non-overlapping and have approximately equal time durations. The second count value is latched by the second latch 435 of the subtractor circuit 452. Thus, the second count value in the second latch 435 is a function of the common-mode current $I_c$. It is to be appreciated that the order in which the first and second count values are generated may be reversed.

The subtractor 450 subtracts the second count value in the second latch 435 from the first count value in first latch 430, and outputs the resulting difference (differential count value) as the output of the ADC 410. The subtraction subtracts out the contribution of the common-mode current to the first count value. As a result, the output of the ADC 410 is approximately a linear function of the sensor current $I_{sensor}$. Since the sensor current $I_{sensor}$ is approximately proportional to the load current, the output of the ACD 410 provides a measurement of the load current.

Thus, the ADC 410 uses one oscillator 415 with time interleaving, in which the first count value (which is a function of the combined current $I_c+I_{sensor}$) and the second count value (which is a function of the common-mode current $I_c$) are generated at different times using the same oscillator 415 and counter 425. An advantage of using the same oscillator to generate the first and second count values instead of two oscillators is that the difference between the first and second count values is not affected by mismatches between the two oscillators (e.g., due to process variation).

In one aspect, the controller 440 may also control the first and second latches 430 and 435 to coordinate the latches with the switches 442 and 446. For example, the controller 440 may enable the first latch 430 when the switches 442 and 446 are closed so that the first latch latches the first count value. The controller 440 may then enable the second latch 435 when the switches are open so that the second latch latches the second count value. For ease of illustration, the connections between the controller 440 and the latches are not shown in FIG. 4.

Figure 5:
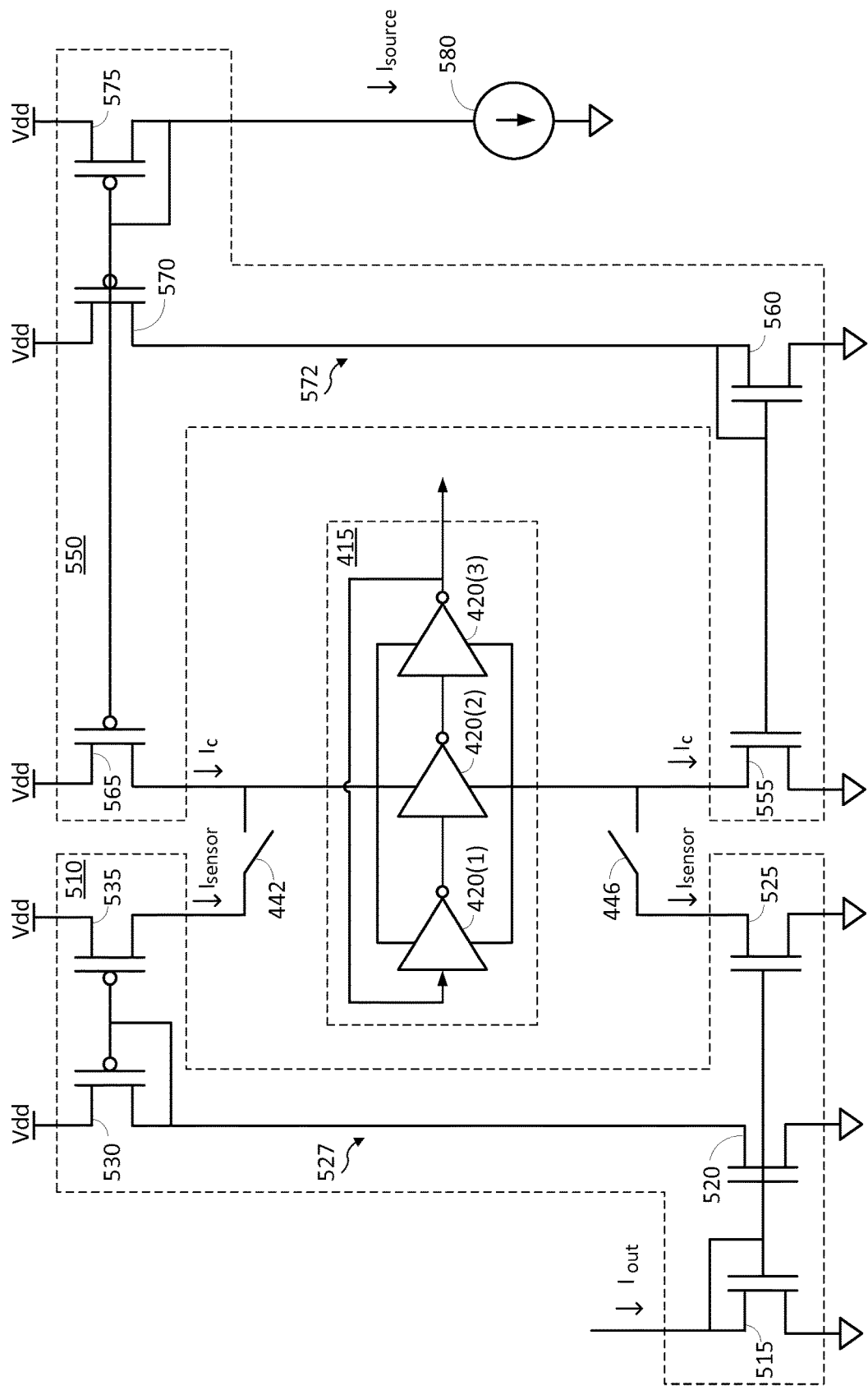
FIG. 5 shows current mirror circuits configured to provide a sensor current and a common-mode current to an oscillator-based ADC according to another embodiment of the present disclosure.

FIG. 5 shows first and second current mirror circuits 510 and 550 according to an embodiment of the present disclosure. The first current mirror circuit 510 is configured receive the output current $I_{out}$ from the current-sensing transistor 125 in FIG. 1, and to produce the sensor current $I_{sensor}$ based on the output current $I_{out}$. The first current mirror circuit 510 may be used to implement the current mirror circuit 145 in FIG. 1.

The first current mirror circuit 510 comprises first, second and third n-type metal-oxide-semiconductor (NMOS) transistors 515, 520 and 525, and first and second PMOS transistors 530 and 535. The gate and drain of the first NMOS transistor 515 are coupled together, and the gates of the first, second and third NMOS transistors 515, 520 and 525 are coupled together, as shown in FIG. 5. The output current $I_{out}$ from the current-sensing transistor 125 flows into the first NMOS transistor 515, and each of the second and third NMOS transistors 520 and 525 mirrors (copies) the output current $I_{out}$ flowing through the first NMOS transistor 515. The mirrored current generated by the third NMOS transistor 525 provides the sensor current $I_{sensor}$ drawn from the oscillator 415. The mirrored current generated by the second NMOS transistor 525 flows through current path 527.

The gate and drain of the first PMOS transistor 530 are coupled together, and the gates of the first and second PMOS transistors 530 and 535 are coupled together, as shown in FIG. 5. The drain of the first PMOS transistor 530 is coupled to current path 527. As a result, the mirrored current from the second NMOS transistor 520 flows through the first PMOS transistor 530, and the second PMOS transistors 535 mirrors (copies) this current. The mirrored current generated by the second PMOS transistor 535 provides the sensor current $I_{sensor}$ input to the oscillator 415.

The sensor current $I_{sensor}$ may be approximately equal to the output current $I_{out}$ or approximately equal to the output current $I_{out}$ multiplied by a current-mirror scaling factor. The current-mirror scaling factor may be equal to, for example, a ratio of the channel width of the third NMOS transistor 525 over the channel width of the first NMOS transistor 515.

The second current mirror circuit 550 is configured to produce the common-mode current $I_c$ based on a source current $I_{source}$ from a current source 580. The second current mirror circuit 550 comprises fourth and fifth NMOS transistors 555 and 560, and third, fourth and fifth PMOS transistors 565, 570 and 575. The gate and drain of the fifth PMOS transistor 575 are coupled together, and the gates of the third, fourth and fifth PMOS transistors 565, 570 and 575 are coupled together, as shown in FIG. 5. The source current $I_{source}$ from the current source flows through the fifth PMOS transistor 575, and each of the third and fourth PMOS transistors 565 and 570 mirrors (copies) the source current $I_{source}$ flowing through the fifth PMOS transistor 575. The mirrored current generated by the third PMOS transistor 565 provides the common-mode current $I_c$ input to the oscillator 415. The mirrored current generated by the fourth PMOS transistor 570 flows down current path 572.

The gate and drain of the fifth NMOS transistor 560 are coupled together, and the gates of the fourth and fifth NMOS transistors 555 and 560 are coupled together, as shown in FIG. 5. The drain of the fifth NMOS transistor 560 is coupled to current path 572. As a result, the mirrored current from the fourth PMOS transistor 570 flows into the fifth NMOS transistor 560, and the fourth NMOS transistors 555 mirrors this current. The mirrored current generated by the fourth NMOS transistor 555 provides the common-mode current $I_c$ drawn from the oscillator 415.

The common-mode current $I_c$ may be approximately equal to the source current $I_{source}$ or approximately equal to the source current $I_{source}$ multiplied by a current-mirror scaling factor. The current-mirror scaling factor may be equal to, for example, a ratio of the channel width of the third PMOS transistor 565 over the channel width of the fifth PMOS transistor 575.

It is to be appreciated that the current mirror circuits 510 and 550 shown in FIG. 5 are exemplary only, and that the sensor current $I_{sensor}$ and common-mode current $I_c$ may be provided using other current mirror configurations. It is also to be appreciated that the counter 425, the first and second latches 430 and 435, the subtractor 450, and the controller 440 are not shown in FIG. 5 for ease of illustration.

Figure 6:
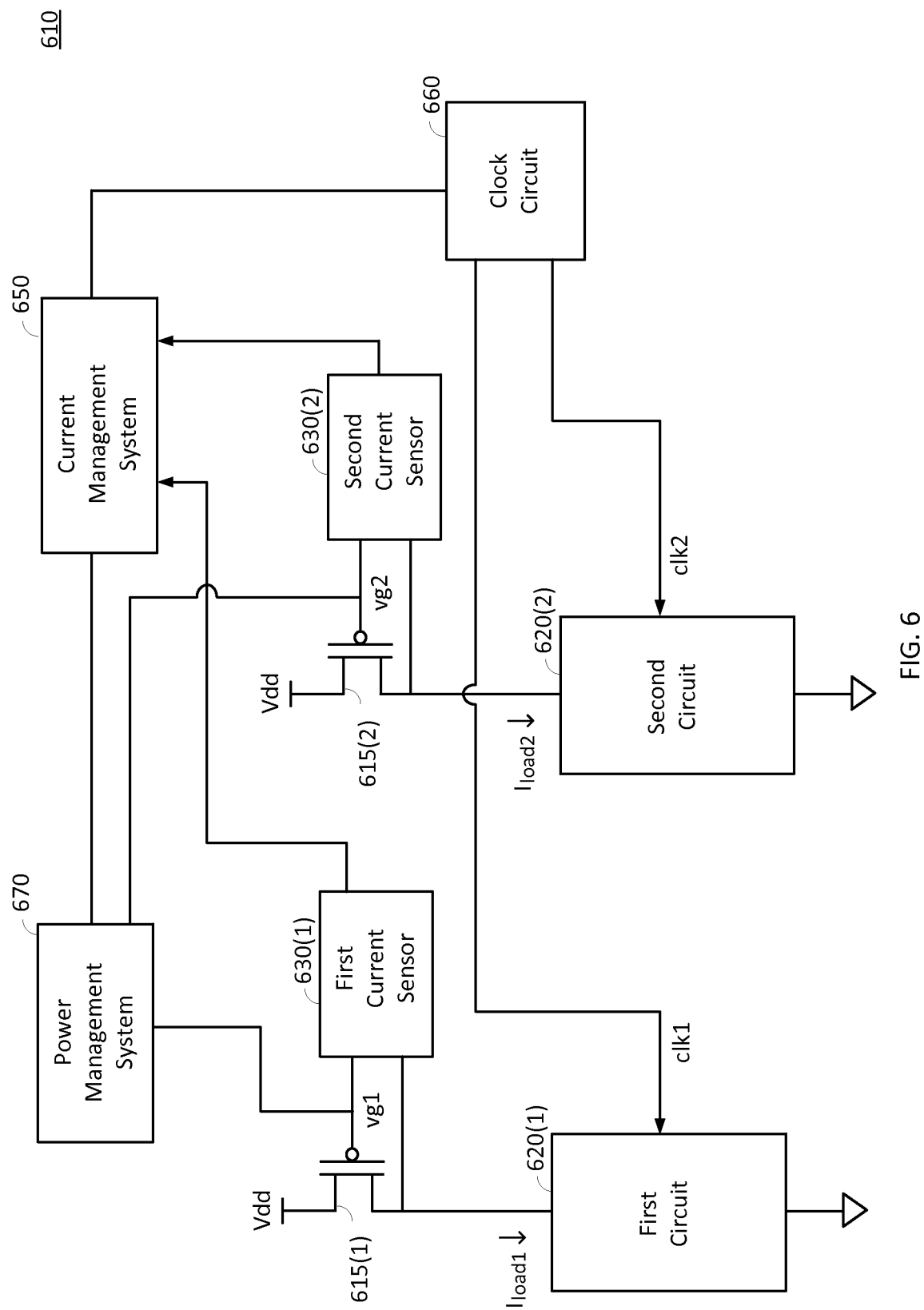
FIG. 6 shows an example of a current-management system according to an embodiment of the present disclosure.

As discussed above, current sensors may be used in current management applications. In this regard, FIG. 6 shows a system 610 comprising first and second circuits 620(1) and 620(2) (e.g., first and second processor cores), first and second power transistors 615(1) and 615(2), first and second current sensors 630(1) and 630(2), a current-management system 650, a power-management system 670, and a clock circuit 660. The system 610 may be integrated on the same chip or die.

The power-management system 670 controls the gate voltages (denoted "vg1" and "vg2") of the first and second power transistors 615(1) and 615(2) to selectively power on the first and second circuits 620(1) to 620(2). For example, the power-management system 670 may turn on the first power transistor 615(1) to power on the first circuit 620(1) by pulling down the respective gate voltage vg1 to ground, and may turn off the first power transistor 615(1) to power off the first circuit 620(1) (e.g., when the first circuit is not in use) by pulling up the respective gate voltage vg1 to the supply voltage Vdd. Similarly, the power-management system 670 may turn on the second power transistor 615(2) to power on the second circuit 620(2) by pulling down the respective gate voltage vg2 to ground, and may turn off the second power transistor 615(2) to power off the second circuit 620(2) (e.g., when the second circuit is not in use) by pulling up the respective gate voltage vg2 to the supply voltage Vdd.

The clock circuit 660 provides a first clock signal (denoted "clk1") to the first circuit 620(1) and a second clock signal (denoted "clk2") to the second circuit 620(2), in which each circuit 620(1) and 620(2) may use the respective clock signal for data sampling, data processing, timing digital logic, etc. The clock circuit 660 may comprise one or more phase-locked loops (PLLs), frequency dividers, etc. In one aspect, the clock circuit 660 is configured to adjust the frequency of the first clock signal clk1 and the frequency of the second clock signal ckl2 under the control of the current-management system 650, as discussed further below.

The first current sensor 630(1) is configured to measure the current (denoted "$I_{load1}$") supplied to the first circuit 620(1) from the power-supply rail Vdd through the first power transistor 615(1). Similarly, the second current sensor 630(2) is configured to measure the current (denoted "$I_{load2}$") supplied to the second circuit 620(2) from the power-supply rail Vdd through the second power transistor 615(2). Each of the current sensors 630(1) and 630(2) may be implemented using the oscillator-based ADC shown in FIG. 3 or FIG. 4, and may be configured to send the respective digital current reading to the current-management system 650 via a respective digital path, as shown in FIG. 6.

The current-management system 650 receives the digital current readings from the first and second current sensors 630(1) and 630(2), and manages the currents to the first and second circuits 620(1) and 620(2) based on the current readings. For example, the current-management system 650 may compare each current reading to a respective current threshold. If the current reading for one of the circuits 630(1) and 630(2) is greater than the respective threshold, then the current-management system 650 may reduce the current to the circuit. In another example, the current-management system 650 may estimate a total current for the chip based on an aggregate of the current readings. If the total current is close to an upper current limit for the chip, then the current-management system 650 may reduce the current to one or more of the circuits 630(1) and 630(2).

The current-management system 650 may reduce the current to a circuit by commanding the clock circuit 660 to reduce the frequency of the clock signal to the circuit. This reduces the operating frequency of the circuit, which, in turn, reduces the dynamic current of the circuit due to switching in the circuit. In another example, the current-management system 650 may reduce the current to a circuit by commanding the power-management system 670 to turn off the respective power transistor to shut down the circuit.

Although two current sensors 630(1) and 630(2) are shown in FIG. 6 for ease of illustration, it is to be appreciated that the system 610 may comprise many current sensors (e.g., tens or hundreds of current sensors) to monitor current across the chip. As discussed above, small low powered current sensors can be implemented using oscillator-based ADCs according to various embodiments of the present disclosure, which allows many current sensors to be integrated on a chip.

Figure 7:
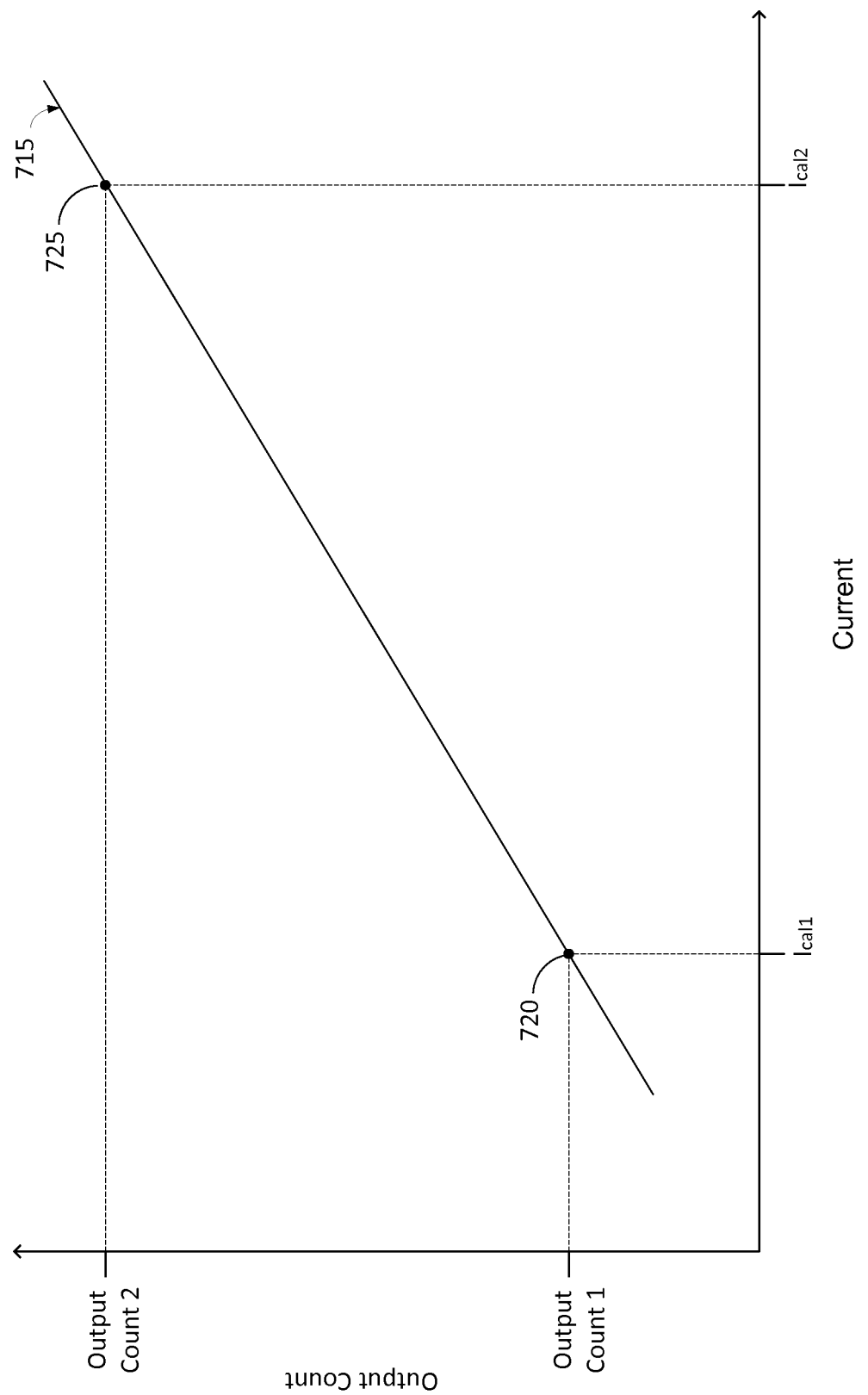
FIG. 7 is a plot illustrating an example of current calibration according to an embodiment of the present disclosure.

In one aspect, the current-management system 650 may calibrate each current sensor 630(1) and 630(2) to obtain more accurate current measurements from the current sensor. In this regard, FIG. 7 shows an exemplary plot 710 illustrating the digital current reading from one of the current sensors as a function of current. In this example, the digital current reading from the current sensor is in the form of an output count value from the oscillator-based ADC of the current sensor. As discussed above, the output count value may be generated by subtracting a second count value from a first count value, where the second count value is based on a common-mode current and the first count value is based on a combined current that is the sum of the common-mode current and a sensor current.

The current-management system 650 may perform a current calibration procedure for the current sensor as follows. First, a first known calibration current (denoted "$I_{cal1}$") may be input to the respective circuit. This may be done, for example, by coupling the circuit to a current source configured to supply the first calibration current to the circuit. The current-management system 650 may then read a corresponding first output count value (denoted "Output Count1") from the current sensor. The first output count value corresponds to point 720 in FIG. 7.

A second known calibration current (denoted "$I_{cal2}$") may then be input to the respective circuit. This may be done, for example, by coupling the circuit to a current source configured to supply the second calibration current to the circuit. The current-management system 650 may then read a corresponding second output count value (denoted "Output Count2") from the current sensor. The second output count value corresponds to point 725 in FIG. 7.

The first and second points 720 and 725 provide the current-management system 650 with enough information to determine the current for the respective circuit for other output count values from the current sensor. This is because the other output count values lie approximately on a line 715 intersecting the first and second points 720 and 725 due to the linear relationship between the output count value and the current.

Thus, once the two calibration points 720 and 725 are determined from the calibration procedure, the current-management system 650 may determine the current for other output count values from the current sensor using linear interpolation. In this embodiment, the first and second output count values (Output Count1 and Output Count 2) may be stored in a memory of the current-management system 650.

The current-management system 650 may perform the current calibration procedure for each one of the other current sensors on the chip. For each current sensor, the current-management system 650 may store the respective output count values corresponding to the calibration currents in the memory.

Figure 8:
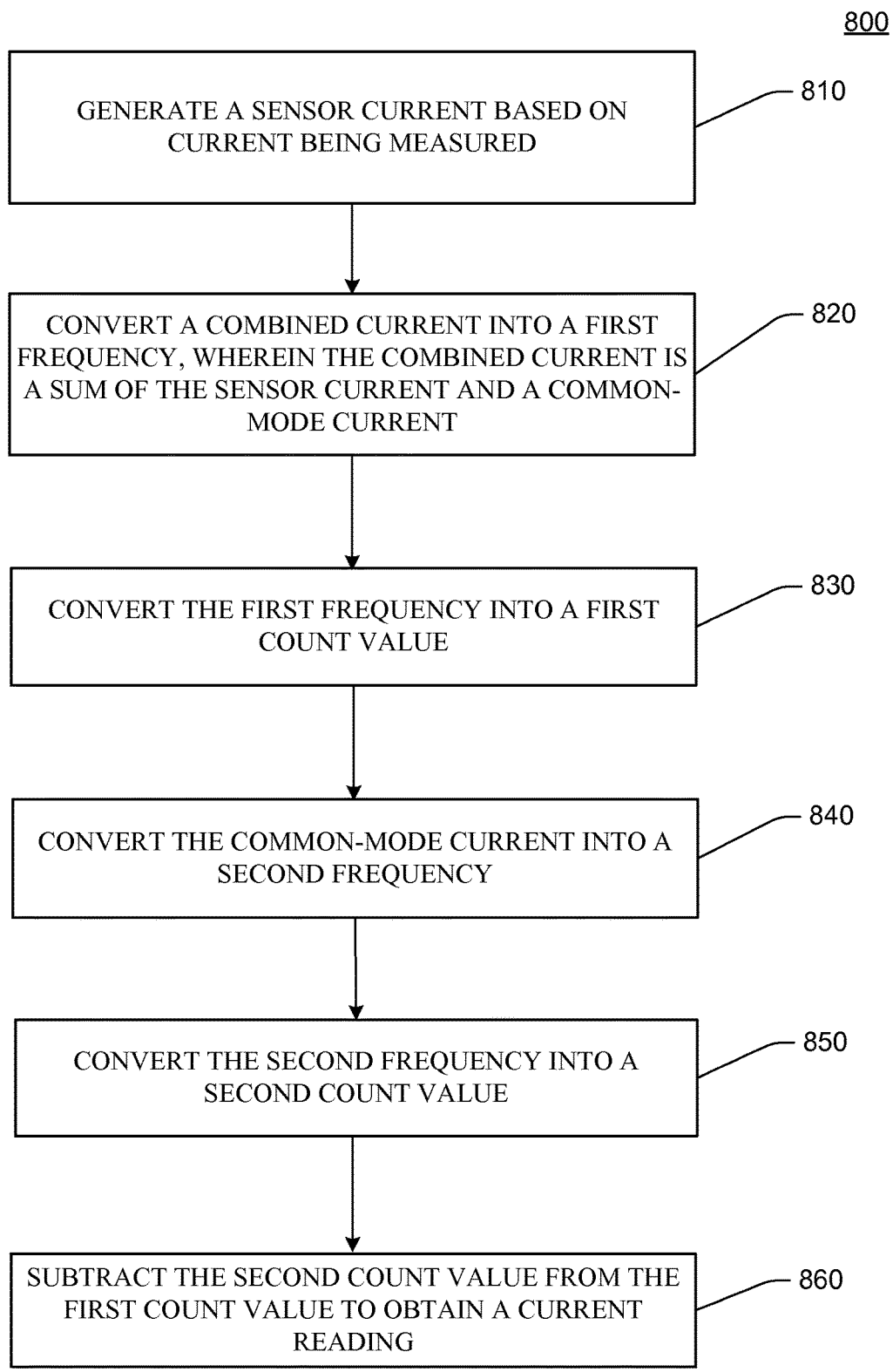
FIG. 8 is a flowchart of a method for measuring current according to an embodiment of the present disclosure.

FIG. 8 shows a method 800 for measuring current according to an embodiment of the present disclosure. The method 800 may be performed, for example, by the current sensor 110 and the oscillator-based ADC shown in FIG. 3 or FIG. 4.

In step 810, a sensor current is generated based on the current being measured. For example, the current being measured may flow through a first transistor (e.g., power transistor 115), and the sensor current may be generated by mirroring the current flowing through the first transistor using a second transistor (e.g., current-sensing transistor 125) having a gate coupled to the gate of the first transistor. In this example, the sensor current may be proportional to the current being measured.

In step 820, a combined current is converted into a first frequency, wherein the combined current is a sum of the sensor current and a common-mode current. For example, the combined current may be converted into the first frequency by a current-controlled oscillator (e.g., oscillator 315 or 415).

In step 830, the first frequency is converted into a first count value. For example, this may be done by counting a number of oscillations of the current-controlled oscillator (e.g., oscillator 315 or 415) over a period of time.

In step 840, the common-mode current is converted into a second frequency. For example, the common-mode current may be converted into the second frequency by the current-controlled oscillator (e.g., oscillator 415) discussed above or a second current-controlled oscillator (e.g., oscillator 335). The second frequency may be lower than the first frequency.

In step 850, the second frequency is converted into a second count value. For example, this may be done by counting a number of oscillations of the current-controlled oscillator (e.g., oscillator 415) or the second current-controlled oscillator (e.g., oscillator 335) over a period of time. The second count value may be smaller than the first count value.

In step 860, the second count value is subtracted from the first count value to obtain a current reading. For example, the second count value may be subtracted from the first count value using a subtractor (e.g., subtractor 350 to 450).

Those skilled in the art would appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection may be properly termed a computer-readable medium to the extent involving non-transient storage of transmitted signals. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium, to the extent the signal is retained in the transmission chain on a storage medium or device memory for any non-transient length of time. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for measuring current, comprising:
   generating a sensor current based on a current being measured;
   converting a combined current into a first frequency using a first current-controlled oscillator, wherein the combined current is a sum of the sensor current and a common-mode current;
   converting the first frequency into a first count value;
   converting the common-mode current into a second frequency using the first current-controller oscillator or a second current-controlled oscillator;
   converting the second frequency into a second count value; and
   subtracting the second count value from the first count value to obtain a current reading.

2. The method of claim 1, wherein the sensor current is approximately proportional to the current being measured.

3. The method of claim 2, wherein the current being measured flows through a first transistor, and wherein generating the sensor current comprises mirroring the current flowing through the first transistor using a second transistor having a gate coupled to a gate of the first transistor.

4. The method of claim 3, wherein the first transistor has a channel width that is at least ten times greater than a channel width of the second transistor.

5. The method of claim 1, wherein converting the first frequency into the first count value comprises counting a number of cycles of the first current-controlled oscillator over a first period of time, and converting the second frequency into the second count value comprises counting a number of cycles of the second current-controlled oscillator over a second period of time.

6. The method of claim 5, wherein the first period of time and the second period of time are approximately the same.

7. The method of claim 1, wherein the first current-controlled oscillator comprises a first plurality of inverters coupled into a loop, and the second current-controlled oscillator comprises a second plurality of inverters coupled into a loop.

8. The method of claim 1, wherein converting the combined current into the first frequency comprises converting the combined current into the first frequency using the first current-controlled oscillator during a first period of time, converting the common-mode current into the second frequency comprises converting the common-mode current into the second frequency using the first current-controlled oscillator during a second period of time, and the first period of time and the second period of time are non-overlapping.

9. The method of claim 8, wherein converting the first frequency into the first count value comprises counting a number of cycles of the first current-controlled oscillator over the first period of time, and converting the second frequency into the second count value comprises counting a number of cycles of the first current-controlled oscillator over the second period of time.

10. The method of claim 1, wherein the common-mode current is approximately constant.

11. The method of claim 1, wherein a dynamic range of the sensor current is at least ten times greater than a dynamic range of the combined current, the dynamic range of the sensor current is defined by a ratio of a first sensor current value over a second sensor current value, and the dynamic range of the combined current is defined by a ratio of a sum of a common-mode current value and the first sensor current value over a sum of the common-mode current value and the second sensor current value.

12. The method of claim 1, wherein the sensor current is generated by mirroring a current supplied from a power-supply rail to a circuit through a power switch.

13. The method of claim 12, wherein the circuit comprises a processor core.

14. Apparatus for measuring current, comprising:
means for generating a sensor current based on a current being measured;
means for converting a combined current into a first frequency, wherein the combined current is a sum of the sensor current and a common-mode current;
means for converting the first frequency into a first count value;
means for converting the common-mode current into a second frequency;
means for converting the second frequency into a second count value; and
means for subtracting the second count value from the first count value to obtain a current reading.

15. The apparatus of claim 14, wherein the sensor current is approximately proportional to the current being measured.

16. The method of claim 14, wherein the common-mode current is approximately constant.

17. The apparatus of claim 14, wherein a dynamic range of the sensor current is at least ten times greater than a dynamic range of the combined current, the dynamic range of the sensor current is defined by a ratio of a first sensor current value over a second sensor current value, and the dynamic range of the combined current is defined by a ratio of a sum of a common-mode current value and the first sensor current value over a sum of the common-mode current value and the second sensor current value.

18. A current sensor, comprising:
a sensor circuit configured to generate a sensor current based on a current being measured;
a first current-controlled oscillator configured to convert a combined current into a first frequency, wherein the combined current is a sum of the sensor current and a common-mode current;
a first counter configured to convert the first frequency into a first count value;
a second current-controlled oscillator configured to convert the common-mode current into a second frequency;
a second counter configured to convert the second frequency into a second count value; and
a subtractor configured to subtract the second count value from the first count value to obtain a current reading.

19. The current sensor of claim 18, wherein the sensor current is approximately proportional to the current being measured.

20. The current sensor of claim 19, wherein the current being measured flows through a first transistor, the sensor circuit comprises a second transistor having a gate coupled to a gate of the first transistor, and the second transistor is configured to mirror the current flowing through the first transistor.

21. The current sensor of claim 18, wherein the first current-controlled oscillator comprises a first plurality of inverters coupled into a loop, and the second current-controlled oscillator comprises a second plurality of inverters coupled into a loop.

22. The method of claim 18, wherein the common-mode current is approximately constant.

23. A current sensor, comprising:
a sensor circuit configured to generate a sensor current based on a current being measured;
a current-controlled oscillator coupled to a common-mode current;
a switch configured to selectively couple the sensor current to the current-controlled oscillator;
a controller configured to close the switch during a first period of time and to open the switch during a second period of time, wherein the current-controlled oscillator is configured to convert a combined current into a first frequency during the first period of time, the combined current being a sum of the sensor current and the common-mode current, and to convert the common-mode current into a second frequency during the second period of time;
a counter configured to convert the first frequency into a first count value and to convert the second frequency into a second count value; and a subtractor circuit configured to subtract the second count value from the first count value to obtain a current reading.

24. The current sensor of claim 23, wherein the sensor current is approximately proportional to the current being measured.

25. The current sensor of claim 24, wherein the current being measured flows through a first transistor, the sensor circuit comprises a second transistor having a gate coupled to a gate of the first transistor, and the second transistor is configured to mirror the current flowing through the first transistor.

26. The current sensor of claim 23, wherein the current-controlled oscillator comprises a plurality of inverters coupled into a loop.

27. The method of claim 24, wherein the common-mode current is approximately constant.

* * * * *